United States Patent [19]

Velo

[11] Patent Number: 4,825,176

[45] Date of Patent: Apr. 25, 1989

[54] CONTROL AMPLIFIER

[75] Inventor: Henri J. Velo, Hilversum, Netherlands

[73] Assignee: AT&T and Philips Telecommunications B.V., Hilversum, Netherlands

[21] Appl. No.: 99,944

[22] Filed: Sep. 23, 1987

[30] Foreign Application Priority Data

Sep. 24, 1986 [NL] Netherlands ............................ 8602409

[51] Int. Cl.[4] .......................... H03G 3/00; H03F 3/45
[52] U.S. Cl. ..................................... 330/254; 330/151
[58] Field of Search ................ 330/254, 260, 69, 151

[56] References Cited

U.S. PATENT DOCUMENTS

T. 886,006  5/1971  Nichols .......................... 330/254 X

Primary Examiner—James B. Mullins
Attorney, Agent, or Firm—Lucian C. Canepa

[57] ABSTRACT

Electronic gain control is achieved by means of a differential controller in combination with a multistage, feedback amplifier. Both the input impedance and the output impedance have a low ohmic value, so that the influence of parasitic capacitances in the differential controller on the bandwidth is significantly reduced.

1 Claim, 1 Drawing Sheet

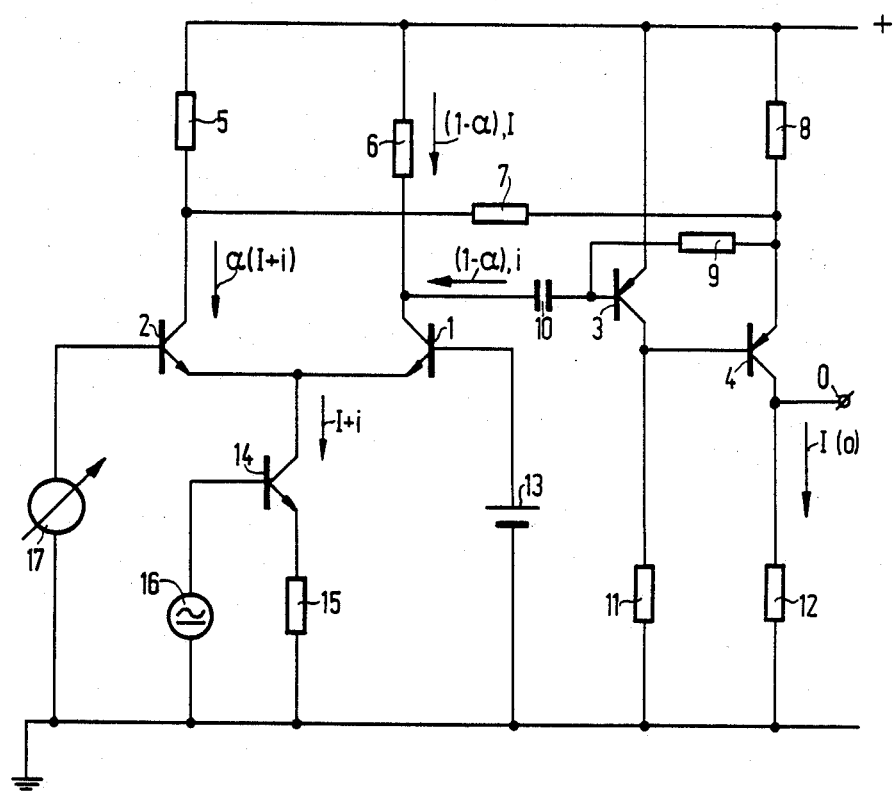

CONTROL AMPLIFIER

The invention relates to a control amplifier having an output, including a first and a second transistor whose emitters are connected to a point of constant potential via a common signal source; a control voltage source being provided between the base electrodes of the two transistors and the collectors of the two transistors being connected to a point of constant potential via at least one resistor. Amplifiers of this type are used for the automatic compensation of telephone cable attenuation or in receivers of broadband optical systems for the automatic compensation of length and temperautre-dependent attenuation of optical links in an optical transmission system.

BACKGROUND OF THE INVENTION

A known control amplifier of this type is described, for example, in Netherlands Patent Application No. 7.908,411 (=PHN 9630). A series arrangement of two resistors is provided between the output of this amplifier and a point of constant potential. The collector of one transistor is coupled to the output and the collector of the other transistor is coupled to the junction of the two resistors. The magnitude of the control rang of this prior art amplifier is determined by the resistance values of the two resistors and is equal to $$A = 20 \cdot \log \frac{R(1) + R(2)}{R(1)} \quad (1)$$

Herein A is the control range, R(1) is the resistance value of the resistor connected to the point of constant potential and R(2) is the resistance value of the resistor connected to the output of the amplifier. The maximum value of R(2) is limited by the collector capacitance of the other transistor, this capacitance also determining the maximum frequency at which the amplifier is still suitable for use. A further limiting factor is the minimal value of R(1). Unavoidably, the resistor connected to the point of constant potential has a parasitic inductance, as a result of which the output voltage of the amplifier will increase versus an increasing frequency, when the impedance of the parasitic inductance is not small with respect to R(1). In view of the foregoing, R(1)=10 Q, and R(2)=90 Q are customary values at a maximum frequency of approximately 700 Mhz. Filling up these values in the relation (1) shows that the maximum control range is equal to 20 dB.

SUMMARY OF THE INVENTION

The invention has for its object to provide measures by means of which the maximum control range can be increased at an unchanged bandwidth. The invention is characterized, in that the collector of the first transistor is connected to the input of a multistage negatively feedback amplifier which exhibits a low input impedance, and that the collector of the second transistor is connected to a second point of low impedance of said amplifier via at least one resistor. The invention will now be described in greater detail with reference to the accompanying FIGURE.

DETAILED DESCRIPTION

In the sole FIGURE, the collector of the transistor 1 is connected to a point of constant potential via a resistor 6 and, via the capacitance 10 to the input of a dual-stage negatively fedback amplifier, constituted by the transistors 3 and 4. The base of the transistor 1 is connected to ground via the d.c. voltage source 13. The emitter of the transistor 1 is connected to the emitter of the transistor 2, the base of the transistor 2 being connected to ground via a control voltage source 17. The collector of the transistor 2 is connected to a point of constant potential via the resistor 5 and to the emitter of transistor 4 of the two-stage amplifier via the resistor 7. The emitters of the transistors 1 and 2 are connected to ground via the series arrangement of the main current path of the transistor 14 and the resistor 15. The base of the transistor 14 is connected to ground via the signal voltage source 16. The emitter of the transistor 3 is connected to a point of constant potential. The collector of the transistor 3 is connected to ground via the resistor 11 and also to the base of the transistor 4, whose collector is connected to ground via the resistor 12 and to the output 0 of the two-stage amplifier. The emitter of the transistor 4 is connected to a point of constant potential via the resistor 8. The base of the transistor 3 is connected to the emitter of the transistor 4 via the resistor 9.

With the aid of the control voltage produced by the control voltage source 17, the current distribution factor $\alpha$ is set, where $0 < \alpha < 1$. This causes a direct current having a value $\alpha.I$ to flow through the main current path of the transistor 2 and a direct current having a value $(1-\alpha).I$ to flow through the main current path of the transistor 1. A signal current having a value $\alpha.i$ also flows through the main current path of the transistor 2 and a signal current having a value $(1-\alpha).i$ flows through the main current path of the transistor 1. The values of the currents I and i are determined by the voltage produced by the input signal source 16 in combination with the value of the resistor 15. Since the input impedance of the amplifier formed by the transistors 3 and 4 is much less than the value of the resistor 6, substantially all the signal current flowing in the main current path of the transistor will flow through the said input impedance via the capacitor 10.

How the control amplifier shown in the FIGURE operates can best be understood when the control amplifier is in its extreme positions, so when $\alpha=0$ or $\alpha=1$. When $\alpha=0$, all the signal current i flows via the capacitor 10 through the low-resistance input impedance of the dual-stage amplifier formed by the transistors 3 and 4. The current gain of this amplifier is in a proper approximation $$\frac{I(0)}{i} = 1 + \frac{R(9)}{R(X)} \quad (2)$$

where I(0) is the output signal current, R(9) is the resistance value of the resistor 9 and R(X) is defined by $$R(X) = \frac{R(8) \cdot [R(5) + R(7)]}{R(5) + R(7) + R(8)} \quad (3)$$

Herein R(8) is the resistance value of the resistor 8, R(5) is the resistance value of the resistor 5 and R(7) is the resistance value of the resistor 7. This means that the maximum current gain of the overall circuit is equal to $$A = 20 \cdot \log \left(1 + \frac{R(9)}{R(X)}\right) \quad (4)$$

For example, when $R(9)/R(X)=4$, this maximum current gain amounts to 14 dB.

When $\alpha=1$, all the signal current i flows through the transistor 2 and is split in the resistors 5 and 7. The right-hand side of the resistor 7 is connected to a very low-impedance point of the dual-stage amplifier, as the result of which the current through the resistor 7 is determined by the relation $$I(7) = i \frac{R(5)}{R(5) + R(7)} \quad (5)$$

In a simple way it can be demonstrated that with a very good approximation this current also flows in the collector of the transistor 4, so that in this case the gain of the control amplifier is equal to $$A = 20 \cdot \log \frac{R(5)}{R(5) + R(7)} \quad (6)$$

When, for example, $R(5)=10$ Q and $R(7)=90$ Q, this gain amounts to $-20$ dB. Combined with the preceding example for $\alpha=0$, this accomplishes an overall control range of 34 dB, so 14 dB larger than with the prior art control amplifier.

The control amplifier has the advantage that the impedances with which the collectors of the transistors 1 and 2 are terminated are low-resistance impedances, so that the influence of the collector capacitances on the bandwidth is much smaller.

An additional advantage is that a parasitic inductance of the resistor 5 can be compensated for by including such an inductance in series with the resistor 7 that splitting the current through the resistors 5 and 7 does not depend on the frequency. This is possible when $R(5)+R(7)>R(8)$.

What is claimed is

1. A control amplifier having an output terminal, including a first and a second transistor whose emitters are connected to a point of constant potential via a common signal source, a control voltage source being provided between the base electrodes of the two transistors, and the collectors of the two transistors being connected to a point of constant potential via at least one resistor, characterized in that the output of said control voltage source is independent of any output appearing at said output terminal, and in that the collector of the first transistor is connected to the input of a multi-stage feedback amplifier which exhibits a low input impedance and that the collector of the second transistor is connected to an internal node point of low impedance of said feedback amplifier via at least one resistor.

* * * * *